United States Patent
Oshima et al.

(10) Patent No.: US 10,355,173 B2
(45) Date of Patent: Jul. 16, 2019

(54) METHOD FOR MANUFACTURING LIGHT EMITTING DEVICE

(71) Applicant: NICHIA CORPORATION, Anan-shi, Tokushima (JP)

(72) Inventors: Yukiko Oshima, Anan (JP); Yoshiki Sato, Anan (JP); Toshiyuki Okazaki, Tokushima (JP); Takayoshi Wakaki, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/837,434

(22) Filed: Dec. 11, 2017

(65) Prior Publication Data

US 2018/0108813 A1 Apr. 19, 2018

Related U.S. Application Data

(62) Division of application No. 14/299,065, filed on Jun. 9, 2014, now Pat. No. 9,871,170.

(30) Foreign Application Priority Data

Jun. 18, 2013 (JP) .................................. 2013-127488

(51) Int. Cl.
  *H01L 33/44* (2010.01)
  *H01L 33/64* (2010.01)
  *H01L 33/48* (2010.01)

(52) U.S. Cl.
  CPC ............ *H01L 33/44* (2013.01); *H01L 33/644* (2013.01); *H01L 33/486* (2013.01); *H01L 2224/48247* (2013.01); *H01L 2224/48257* (2013.01); *Y10T 29/49002* (2015.01)

(58) Field of Classification Search
None
See application file for complete search history.

(56) References Cited

U.S. PATENT DOCUMENTS

| | | | |
|---|---|---|---|
| 5,482,768 | A | 1/1996 | Kawasato et al. |
| 5,871,843 | A | 2/1999 | Yoneda et al. |
| 6,166,855 | A | 12/2000 | Ikeyama et al. |
| 2001/0033913 | A1 | 10/2001 | Murata et al. |
| 2001/0035929 | A1 | 11/2001 | Nakamura et al. |
| 2004/0156110 | A1 | 8/2004 | Ikeyama |

(Continued)

FOREIGN PATENT DOCUMENTS

| | | |
|---|---|---|
| JP | 2006-257295 A | 9/2006 |
| JP | 2008-137868 A | 6/2008 |

(Continued)

*Primary Examiner* — Shaun M Campbell
(74) *Attorney, Agent, or Firm* — Global IP Counselors, LLP

(57) ABSTRACT

A method for manufacturing a light emitting device includes: integrally molding a package and a lead, the package arranged to form at least part of an inner peripheral face of a recess portion in which the light emitting element is housed, the package including a base material and a plurality of particles, the base material including a resin, a coefficient of thermal expansion of the particles being different from a coefficient of thermal expansion of the base material; and covering the inner peripheral face of the recess portion with a cover film, the cover film having light transmissive and electrical insulation.

5 Claims, 8 Drawing Sheets

(56) References Cited

U.S. PATENT DOCUMENTS

| | | |
|---|---|---|
| 2007/0104896 A1 | 5/2007 | Matsunaga et al. |
| 2011/0068322 A1* | 3/2011 | Pickett .................. C09K 11/02 |
| | | 257/13 |
| 2011/0117686 A1 | 5/2011 | Zhang et al. |
| 2011/0127546 A1 | 6/2011 | Jaus et al. |
| 2011/0220496 A1 | 9/2011 | Oya et al. |
| 2011/0248623 A1* | 10/2011 | Ichikawa .................. F21K 9/00 |
| | | 313/483 |
| 2012/0037944 A1 | 2/2012 | Takine |
| 2012/0049225 A1* | 3/2012 | Wakaki .................. H01L 33/44 |
| | | 257/98 |
| 2012/0111621 A1 | 5/2012 | Ohigashi et al. |
| 2013/0242605 A1 | 9/2013 | Zhao et al. |
| 2015/0179900 A1 | 6/2015 | Pickett et al. |

FOREIGN PATENT DOCUMENTS

| | | |
|---|---|---|
| JP | 2008-192880 A | 8/2008 |
| JP | 2009-004503 A | 1/2009 |
| JP | 2010-153624 A | 7/2010 |
| JP | 2011-105898 A | 6/2011 |
| JP | 2011-209280 A | 10/2011 |
| JP | 2012-069539 A | 4/2012 |
| JP | 2013-505347 A | 2/2013 |
| JP | 2013-089834 A | 5/2013 |
| WO | 2010-150754 A1 | 12/2010 |
| WO | 2011-036447 A1 | 3/2011 |

* cited by examiner

METHOD FOR MANUFACTURING LIGHT EMITTING DEVICE

CROSS-REFERENCE TO RELATED APPLICATION

This application is a divisional application of U.S. patent application Ser. No. 14/299,065, filed on Jun. 9, 2014. This application claims priority to Japanese Patent Application No. 2013-127488, filed on Jun. 18, 2013. The entire disclosures of U.S. patent application Ser. No. 14/299,065 and Japanese Patent Application No. 2013-127488 is hereby incorporated herein by reference.

BACKGROUND

Field of the Invention

The present disclosure relates to a light emitting device comprising a light emitting element and a package, and to a method for manufacturing this device.

Background Art

Light emitting devices have been widely used as light sources for liquid crystal television backlights, illumination devices, optical communications devices, and so forth. Light emitting device comprising a light emitting element and a package having a recess portion that houses the light emitting element are known (see Japanese Laid-Open Patent Application 2010-153624, for example).

SUMMARY

A method for manufacturing a light emitting device according to one embodiment includes: integrally molding a package and a lead, the package arranged to form at least part of an inner peripheral face of a recess portion in which the light emitting element is housed, the package including a base material and a plurality of particles, the base material including a resin, a coefficient of thermal expansion of the particles being different from a coefficient of thermal expansion of the base material; and covering the inner peripheral face of the recess portion with a cover film, the cover film having light transmissive and electrical insulation.

The embodiments of the present invention provide a light emitting device with which package durability can be raised while suppressing discoloration of the package, as well as a method for manufacturing this device.

DETAILED DESCRIPTION

Covering the inner peripheral face of the recess portion, which is susceptible to the effects of light and heat, with a cover film may be considered an effective way to increase the durability of a light emitting device.

However, if the inner peripheral face is covered with a cover film, the resin material will be decomposed by heat and light and the substances thus produced will accumulate in the interior of the package, so there may be the risk of discoloration to the package. Also, if the supply of oxygen to the interior of the package is blocked by a cover film, there may be also the risk that the decomposition of the material constituting the package will proceed and result in temporary package discoloration.

The embodiments of the present invention are to provide a light emitting device with which package durability can be raised while suppressing discoloration of the package, as well as a method for manufacturing this device.

Embodiments of the present invention will now be described through reference to the drawings. In the discussion of the drawings, portions that are the same or similar will be given the same or similar reference numbers. The drawings, however, are merely schematic in nature, and the dimensional relationships and so forth may differ from those in actual structure. Therefore, the specific dimensions and so forth should be determined by referring to the following description.

Configuration of Light Emitting Device 100

Figure 1:
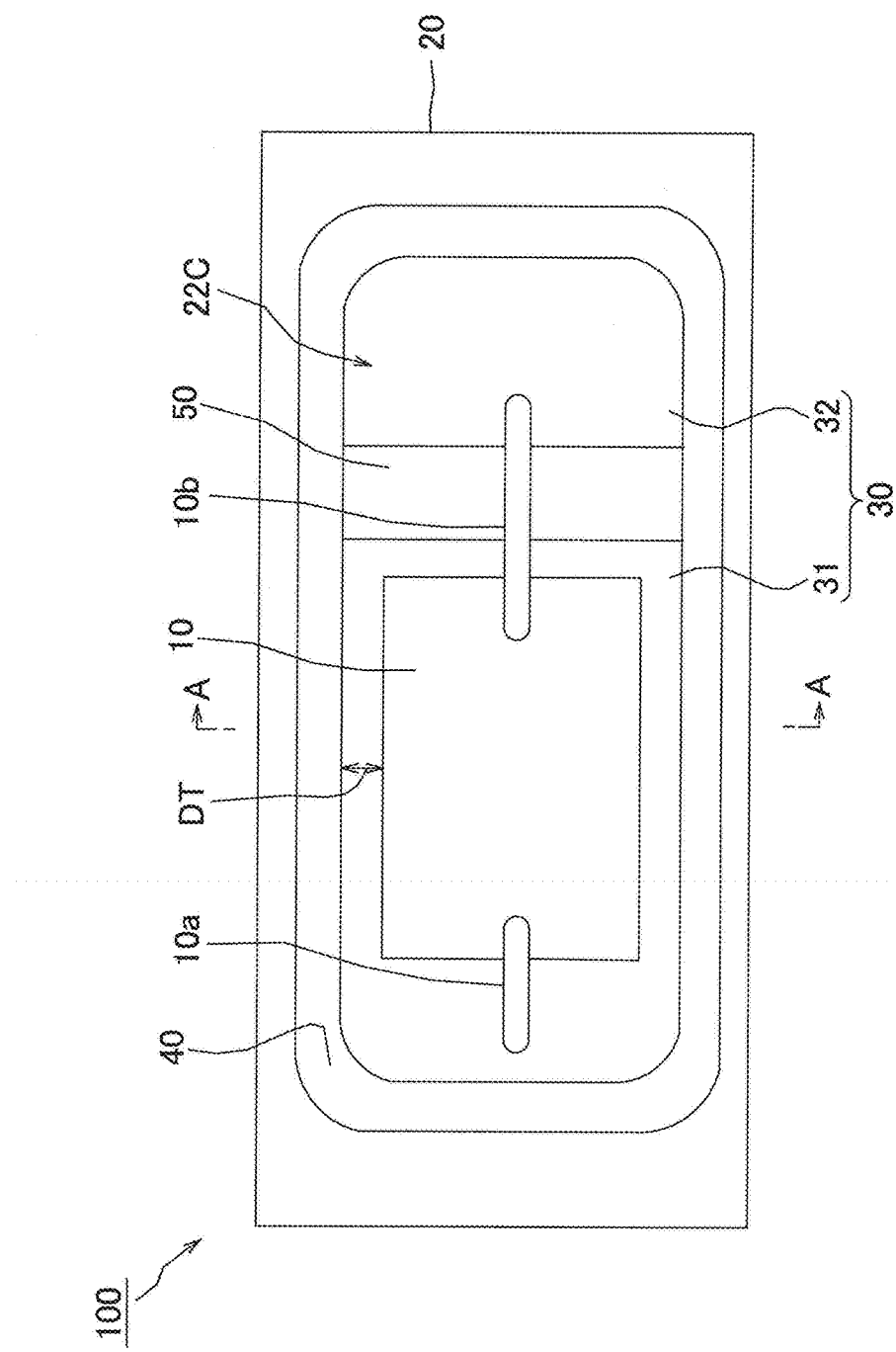
FIG. 1 is a schematic plan view of a light emitting device according to an embodiment.
Figure 2:
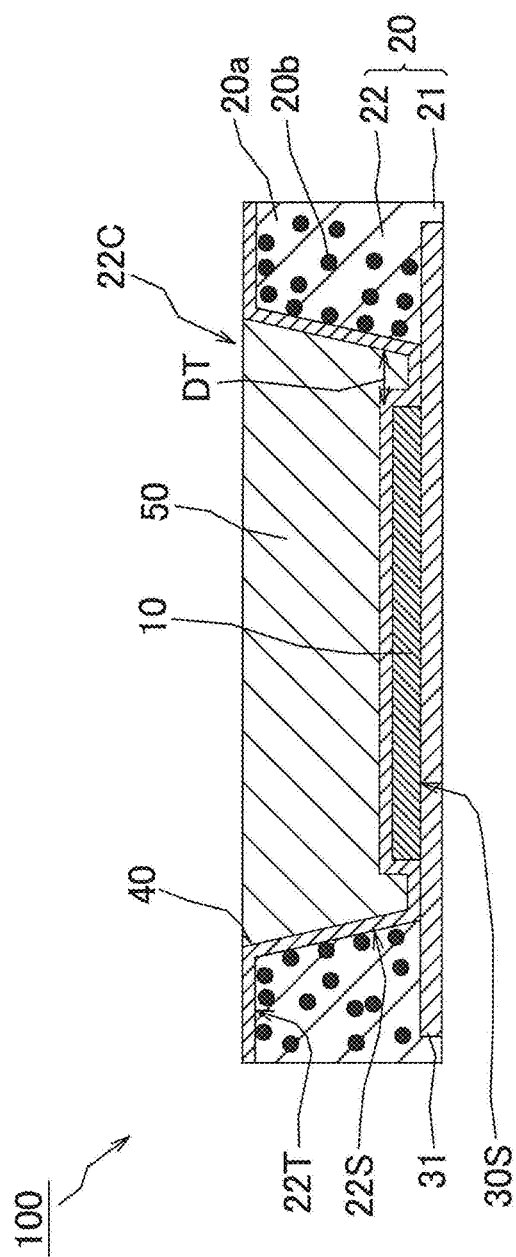
FIG. 2 is a schematic cross section along the A-A line in FIG. 1.

The configuration of a light emitting device 100 will be described through reference to the drawings. FIG. 1 is a schematic plan view of the light emitting device 100. FIG. 2 is a schematic cross section along the A-A line in FIG. 1.

The light emitting device 100 in this embodiment comprises a light emitting element 10, a package 20, a pair of leads 30, a cover film 40, and a sealing member 50.

Light Emitting Element 10

The light emitting element 10 is housed in a recess portion 22C, at least part of which is formed by the package 20. The light emitting element 10 can be mounted on the bottom face of the recess portion 22C, and as shown in FIG. 1, can be mounted on the leads 30. The light emitting element 10 is fixed to the leads 30 by an adhesive, for example. The light emitting element 10 is electrically connected to the leads 30 via a first wire 10a and a second wire 10b in this embodiment.

The light emitting element 10 includes a semiconductor layer that emits light. The light emitting element 10 can be, for example, an LED that emits blue or ultraviolet light and is constituted with a nitride semiconductor expressed by the following General Formula 1.

$$Al_X Ga_Y In_Z N \qquad (1)$$

In General Formula 1, $0 \leq X \leq 1$, $0 \leq Y \leq 1$, $0 \leq Z \leq 1$, and $X+Y+Z=1$.

This light emitting element 10 can be formed, for example, by epitaxial growth of a nitride semiconductor such as InN, AlN, InGaN, AlGaN, or InGaAlN on a substrate by MOCVD or another such vapor phase growth method.

The light emitting element 10 may also be constituted with a semiconductor such as ZnO, ZnS, ZnSe, SiC, GaP, GaAlAs, or AlInGaP, instead of a nitride semiconductor. This semiconductor may have a laminar structure in which an n-type semiconductor layer, a light emitting layer (active layer), and a p-type semiconductor layer are formed in that order. The light emitting layer is preferably a laminated semiconductor with a multiple quantum well structure or a single quantum well structure, or a laminated semiconductor with a double hetero structure. When a sapphire substrate or other such transmissive substrate is used, light will be more likely to be emitted laterally from the light emitting layer than when a non-translucent substrate is used, so the effect on the package 20 is intensified.

The peak wavelength of the light emitted by the light emitting element 10 can be selected from ultraviolet to infrared light, according to the material of the semiconductor and its mixed crystal ratio (compositional ratio). The peak wavelength of the emitted light can be from 350 to 800 nm, with 360 to 520 nm being preferable, and 420 to 480 nm (that is, the short wavelength band of visible light) being more preferable. The shorter is the peak wavelength of the emitted light, the higher is the energy of the emitted light, so the damage on the package 20 is intensified.

The mounting type of the light emitting element 10 may be either face-up mounting or flip-chip mounting. With the light emitting element 10, the n-side electrode and the p-side electrode may be formed on the same side, and the n-side electrode and the p-side electrode may also be formed on opposite sides with the semiconductor in between.

Package 20

The light emitting device 100 has the recess portion 22C for housing the light emitting element 10. The package 20 forms at least part of the inner peripheral face 22S of this recess portion 22C. The recess portion 22C has at least a base part 21 and a side wall part 22. In this embodiment, the package 20 forms the entire inner peripheral face of the recess portion 22C along with forming the side faces of the light emitting device 100. The base part 21 and the side wall part 22 of the recess portion 22C can be molded integrally with the package 20.

The light emitted by the light emitting element 10 is reflected by the inner peripheral face 22S of the recess portion 22C, causing it to be released from the recess portion 22C to the outside. The recess portion 22C is formed in a substantially square, truncated pyramidal shape, and gradually widens toward the open side of the recess portion 22C in this embodiment. This affords efficient release of the emitted light of the light emitting element 10 to the outside of the light emitting device 100. However, the inner peripheral face 22S may be substantially perpendicular to the bottom face of the recess portion 22C.

The spacing DT between the light emitting element 10 and the side wall part 22 (that is, the inner peripheral face 22S) in a direction parallel to the bottom face of the recess portion 22C can be between 0.05 and 2 mm. In the case where the spacing DT is than 0.5 mm or less, the light emitted from the light emitting element 10 will have a greater effect on the side wall part 22, and the side wall part 22 will be prone to decomposition by heat and light. In the case where the inner peripheral face 22S is substantially perpendicular to the bottom face of the recess portion 22C, the spacing DT between the inner peripheral face 22S and the light emitting element 10 will tend to be smaller, so light emitted from the light emitting element 10 will have a particularly great effect on the side wall part 22.

In this embodiment, the outer shape of the package 20 can be cuboid, but this is not the only option, and the shape may instead be that of a circular cylinder, a triangular prism or a polyhedral prism with a 5 or more sided polygonal base, or a shape similar to these. The package 20 can be formed by mixing the materials of a base material 20a, particles 20b, etc. (discussed below), and then molding this mixture by injection molding or transfer molding, for example.

In this embodiment, the package 20 includes the base material 20a, which is made up of a resin and an optional filler, and a plurality of particles 20b mixed into the base material 20a.

Any kind of resin may be used for the base material 20a, but a thermosetting resin with high light resistance is favorable. Examples of this thermosetting resin include epoxy resins, triazine derivative epoxy resins, modified epoxy resins, silicone resins, modified silicone resins, acrylate resins, and urethane resins. The percentage in which the resin is contained in the package 20 can be from 10 to 30 wt %, for example.

Examples of the filler of the substrate 20a include light reflecting members, inorganic fillers, curing catalysts, diffusing agents, pigments, phosphorescent substances, reflective substances, light blocking substances, light stabilizers, and parting agents. The filler in this embodiment includes titanium dioxide as a light reflecting member, and silicon dioxide as an inorganic filler. The percentage in which the titanium dioxide is contained with respect to the entire package 20 can be from 10 to 30 wt %, for example. The percentage in which the silicon dioxide is contained with respect to the entire package 20 can be from 50 to 80 wt %, for example.

A plurality of particles 20b are mixed into the base material 20a. The particles 20b need only be disposed at least near the inner peripheral face 22S of the recess portion, and need not be included in the entire package 20. The particles 20b are made of a material whose coefficient of thermal expansion is different from that of the base material 20a. Silicone rubber is favorable as the material of these particles 20b when the base material 20a is an epoxy resin, but other materials can also be used.

The cross sectional shape of the particles 20b can be circular, elliptical, and various other shapes. The equivalent circle diameter of the particles 20b can be about 1 to 10 μm, for example. As will be discussed below, microcracks 40a are formed in the cover film 40 by expansion and contraction of the particles 20b as the temperature changes. The percentage in which the particles 20b are contained with respect to the entire package 20 can be from 0.5 to 5 wt %, for example.

Leads 30

The leads 30 can be disposed on the bottom face of the recess portion 22C, as in this embodiment. The leads 30 usually have a first lead 31 and a second lead 32.

The first lead 31 and the second lead 32 are a pair of positive and negative electrodes for electrically connecting the light emitting element 10 to external electrodes. As shown in FIG. 1, the first lead 31 and the second lead 32 are disposed on the bottom face of the recess portion 22C and extend in different directions. The first lead 31 and the second lead 32 are exposed on the bottom face side of the light emitting device 100. Also, the first lead 31 and the second lead 32 may protrude from the side face of the package 20 to the outside. In this case, they may be bent toward the bottom face side of the light emitting device 100, or they may protrude straight out from the side face of the light emitting device 100.

The leads 30 are formed using iron, phosphor bronze, a copper alloy, or another such good electrical conductor, for example. A plating layer for raising the reflectivity of light emitted from the light emitting element 10 is preferably formed on the surface of the leads 30. The plating layer can be made of a material including silver, aluminum, copper, gold, or the like, and preferably includes silver because of its high light reflectivity. The plating layer may be formed by plating just an exposed face 30S of the leads 30 that is exposed within the recess portion 22C, or may be formed by plating the entire surface of a lead frame prior to separation into individual units.

Cover Film 40

The cover film 40 covers at least part of the inner peripheral face 22S of the recess portion 22C formed by the package 20. In this embodiment, it covers the entire inner peripheral face 22S of the recess portion 22C, the top face 22T of the side wall part 22, the exposed face 30S of the leads 30, and the surface of the light emitting element 10. The thickness of the cover film 40 can be from 3 to 100 nm.

The cover film 40 is made of a material that is light-transmissive and electrically insulating. Examples of such a material include aluminum oxide, silicon dioxide, titanium dioxide, and zinc oxide. In this embodiment, "transmissive" means that the material absorbs no more than 50% of the light emitted from the light emitting element 10, with 20% or less being particularly favorable.

The cover film 40 can be formed by a conventional thin-film formation method. Examples of thin-film formation methods include CVD (chemical vapor deposition) and sputtering. Of CVD methods, ALD (atomic layer deposition) is particularly favorable when the density of the cover film 40 is to be increased.

The cover film 40 functions as a protective film that protects the inner peripheral face 22S of the recess portion 22C formed by the package 20, particularly the side wall part 22. This configuration improves the durability of the side wall part 22. In the case where the surface of the leads 30 is given a silver plating layer, the cover film 40 can also function as a sulfuration suppression film that suppresses the sulfuration of the leads 30. If, however, the cover film 40 is formed dense by ALD or is formed thick by CVD, the sulfuration of silver can be effectively suppressed, but on the other hand gas permeability will be lower. Accordingly, if the package 20 is decomposed by heat or light emitted from the light emitting element 10, decomposition products and oxygen will not readily pass through the cover film 40.

Figure 3:
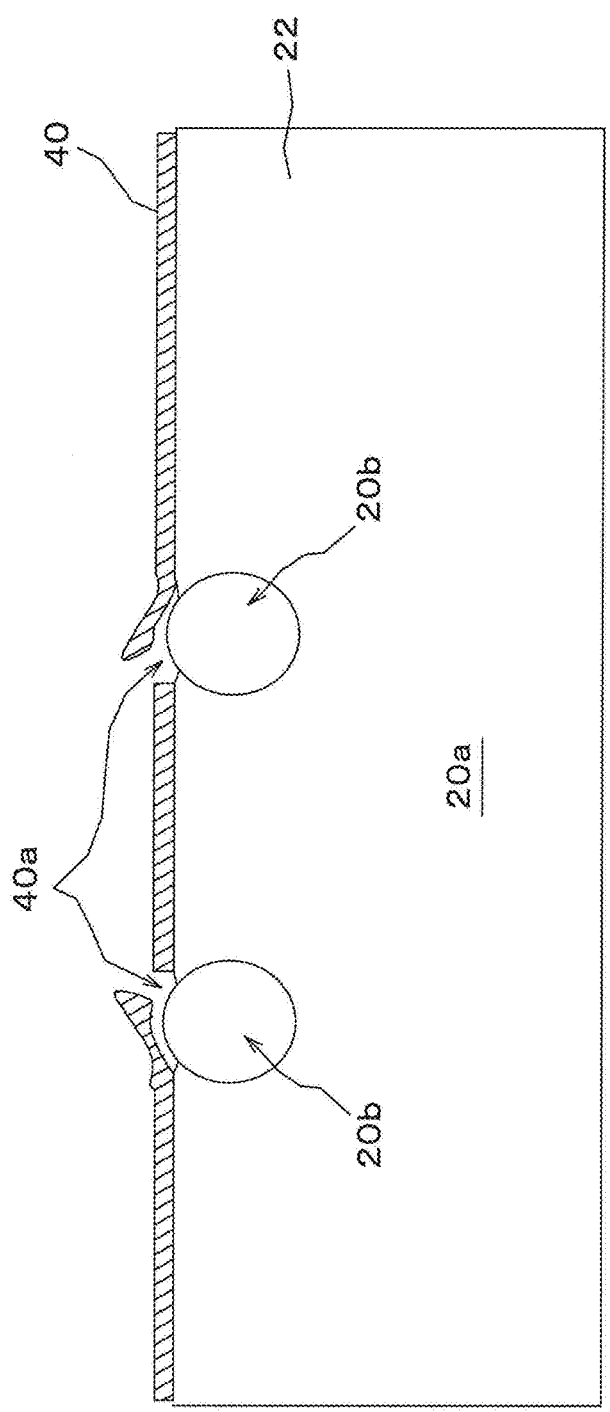
FIG. 3 is a schematic cross section of a package and a cover film according to an embodiment.
Figure 4:
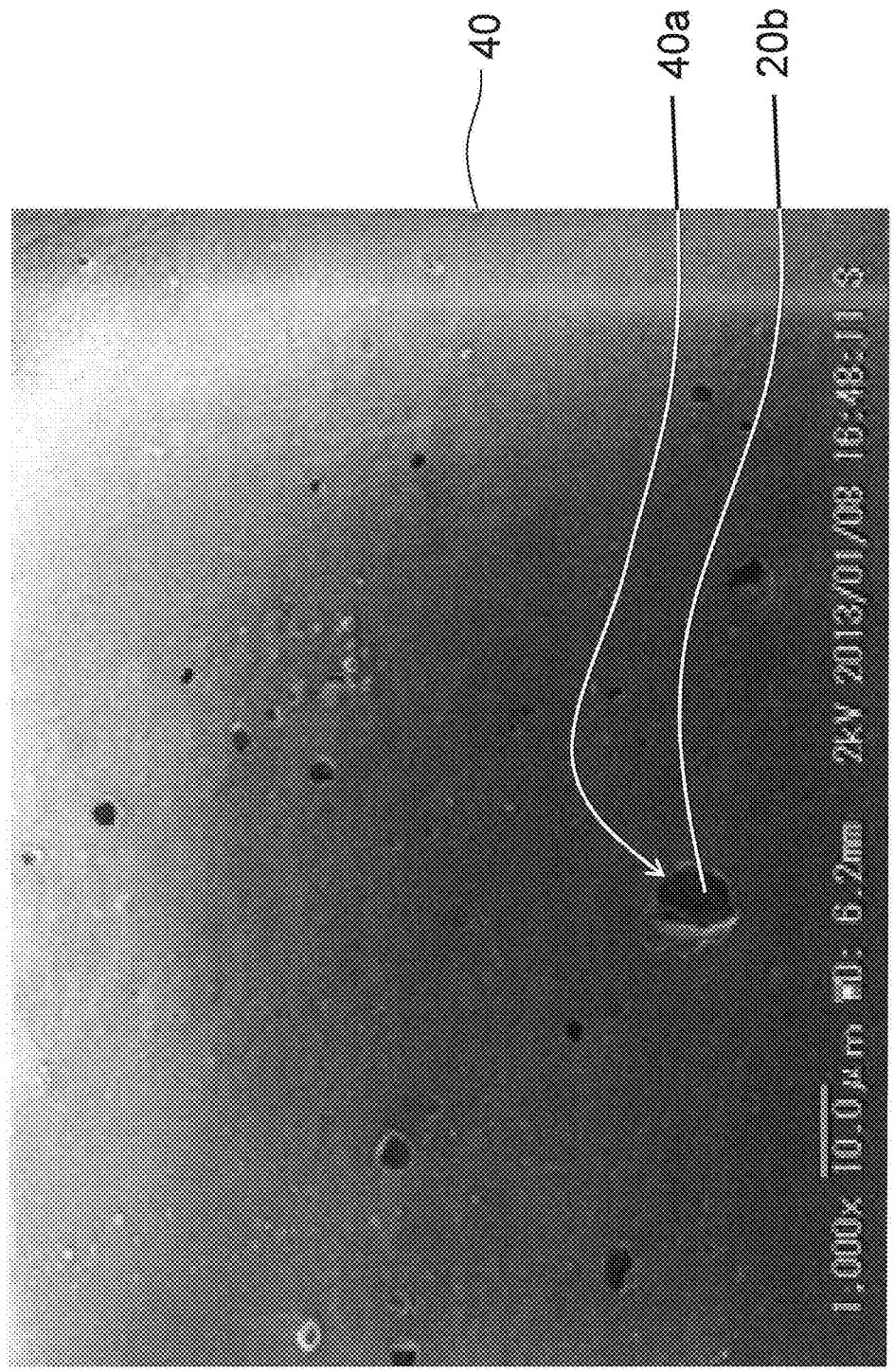
FIG. 4 is an SEM image of the surface of the cover film according to an embodiment.
Figure 5:
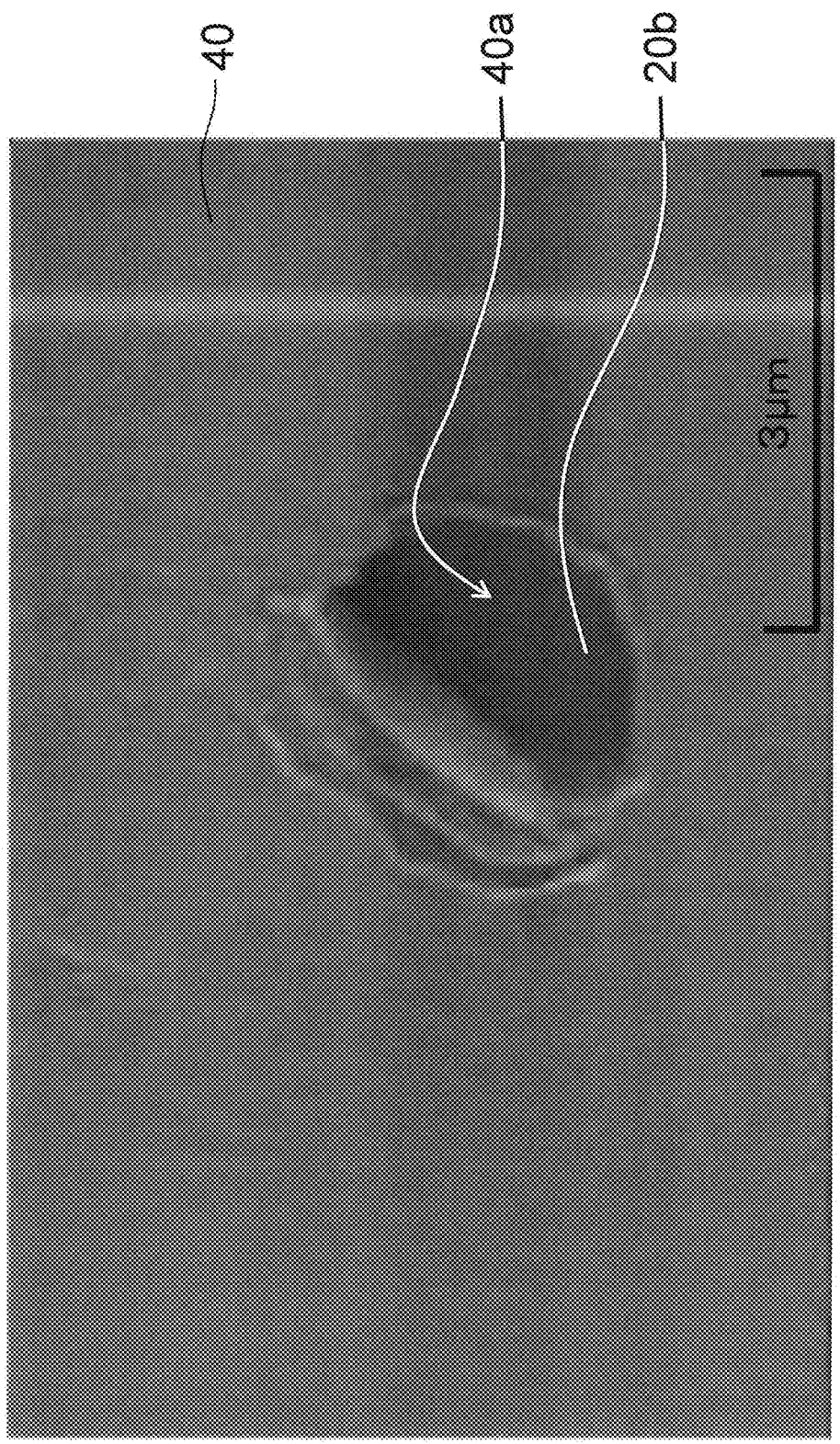
FIG. 5 is a detail SEM image of the surface of the cover film according to an embodiment.

FIG. 3 is a schematic cross section of the package 20 and the cover film 40. FIG. 4 is an SEM (scanning electron microscope) image of the portion of the cover film that covers the inner peripheral face 22S. FIG. 5 is a detail SEM image of the surface of the cover film 40. In FIG. 3, the cross section is perpendicular to the inner peripheral face 22S.

As shown in FIGS. 3 to 5, a plurality of microcracks 40a are formed in the cover film 40. The microcracks 40a can be formed on the particles 20b located near the inner peripheral face 22S of the recess portion 22C formed by the package 20. The width WD of the microcracks 40a can be about 0.5 to 30 μm. The width WD of the microcracks 40a can be adjusted according to the size of the particles 20b. In FIGS. 3 to 5, the microcracks 40a are shown as holes formed by tearing the cover film 40, but if the cover film 40 is held down by the sealing member 50, the microcracks 40a will be formed as slits. The microcracks 40a do not need to be formed in a special step, and as discussed later, they can be allowed to form as the temperature drops after the formation of the cover film 40.

The frequency at which the microcracks 40a are formed is preferably such that those with a diameter of about 5 μm are present in a number of at least 500 per square millimeter on the surface of the cover film 40. The proportion of the surface area of the cover film 40 accounted for by the microcracks 40a is preferably at least 1.5%. This allows the decomposition products to be efficiently released from the microcracks 40a to the outside when the package 20, particularly the side wall part 22, is decomposed by the emitted light and heat. As a result, there will be less discoloration of the package 20 caused by decomposition products. Furthermore, since oxygen can be supplied to the interior through the microcracks 40a, the decomposition of the constituent material brought about by a lack of oxygen can also be suppressed. The frequency of the microcracks 40a and the proportion of the surface they account for can be easily adjusted by varying the content of the particles 20b with respect to the package 20 as a whole.

The frequency of the microcracks 40a is preferably no more than 6000 microcracks per square millimeter on the surface of the cover film 40. The proportion of the surface area of the cover film 40 accounted for by the microcracks 40a is preferably no more than 5%.

Sealing Member 50

In this embodiment, the sealing member 50 fills the recess portion 22C and seals the light emitting element 10. There are no particular restrictions on the material of the sealing member 50, but it is preferable to use a resin with excellent transmissive, heat resistance, weather resistance, and light resistance. The various thermosetting resins listed above are examples of such a resin.

The sealing member 50 may contain a filler, a diffusing agent, a pigment, a phosphorescent substance, a reflective substance, or other such known additives. Examples of favorable diffusing agents include barium titanate, titanium oxide, aluminum oxide, and silicon oxide.

The sealing member 50 may contain a phosphorescent substance that undergoes wavelength conversion upon absorbing the light emitted from the light emitting element 10. Examples of phosphorescent substances include SiAlON-based phosphors, oxynitride-based phosphors, and nitride-based phosphors activated mainly by europium, cerium, and other such lanthanoid elements; germanates, alkaline earth silicon nitrides, alkaline earth thiogallates, alkaline earth sulfides, alkaline earth silicates, alkaline earth metal aluminate phosphors, alkaline earth metal halogen borate phosphors, and alkaline earth halogen apatite phosphors activated mainly by europium and other such lanthanoid elements or manganese and other such transition metal elements; rare earth silicates and rare earth aluminates activated mainly by cerium and other such lanthanoid elements; and organics and organic complexes activated mainly by activated mainly by europium and other such lanthanoid elements.

A part of the sealing member 50 may be provided so that it goes into the microcracks 40a, and may be provided so as to block off the openings of the microcracks 40a.

Method for Manufacturing Light Emitting Device 100

Figure 6A:
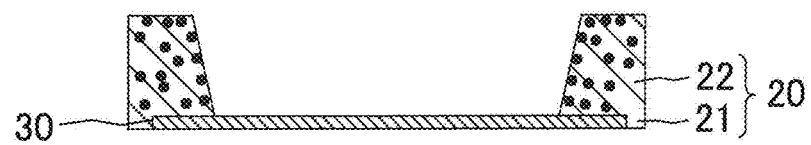
FIG. 6A is a schematic cross section illustrating a method for manufacturing a light emitting device according to an embodiment.
Figure 6B:
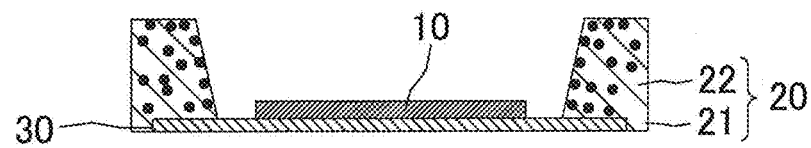
FIG. 6B is a schematic cross section illustrating a method for manufacturing a light emitting device according to an embodiment.
Figure 6C:
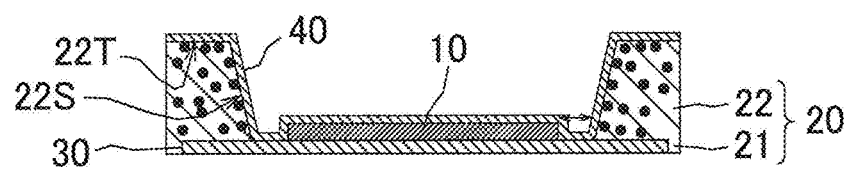
FIG. 6C is a schematic cross section illustrating a method for manufacturing a light emitting device according to an embodiment.

A method for manufacturing the light emitting device 100 will be described through reference to the drawings. FIGS. 6A to 6C is a schematic cross section illustrating a method for manufacturing the light emitting device 100.

First, as shown in FIG. 6A, the package 20 and the leads 30 are integrally molded by placing the leads 30 in a metal mold pouring the material of the package 20 into the metal mold and solidifying the material of the package 20. The recess portion 22C used to house the light emitting element 10 is formed in the package 20 at this point. The leads 30 are exposed on the bottom face of the recess portion 22C.

Next, as shown in FIG. 6B, the light emitting element 10 is mechanically connected to the leads 30 with an adhesive.

Next, the light emitting element 10 is electrically connected to the leads 30 by the first wire 10a and the second wire 10b.

Next, as shown in FIG. 6C, a thin-film formation method is used to cover the inner peripheral face 22S of the recess portion 22C, the top face 22T of the side wall part 22, the exposed face 30S of the leads 30, and the surface of the light emitting element 10 with the cover film 40. More specifically, a method in which an aluminum oxide film is formed by ALD will be described. First, $H_2O$ vapor is introduced into a chamber to form OH groups on the targets to be covered (in this embodiment, the side wall part 22, the leads 30, and the light emitting element 10). Next, the surplus vapor is evacuated, after which TMA (trimethylaluminum) gas is introduced into the chamber to react the TMA with the OH groups on the surface of the targets to be covered by the cover film 40 (in this embodiment, the side wall part 22, the leads 30, and the light emitting element 10) (first reaction). Next, $H_2O$ vapor is introduced into the chamber to react the $H_2O$ with the TMA bonded to the OH groups (second reaction). Next, the surplus vapor is evacuated, after which the first and second reactions are repeated to form a dense aluminum oxide film with the desired thickness. The microcracks 40a are formed here by the expansion and contraction of the particles 20b inside the side wall part 22 while the temperature is lowered after the formation of the cover film 40.

Next, the recess portion 22C is filled with the sealing member 50, and the sealing member 50 is heated and cured.

This completes the light emitting device 100.

Other Embodiments

An embodiment of the present invention was given above, but the text and drawings that form a part of this disclosure should not be interpreted to limit this invention. Various alternative embodiments, working examples, and application technology should be clear to a person skilled in the art from this disclosure.

In the above embodiment, one light emitting element 10 was housed in the recess portion 22C, but this is not the only option, and a plurality of light emitting elements 10 may be housed in the recess portion 22C. In this case, the light emitting elements 10 may all be the same type, or the emission peak wavelength may vary with each light emitting element 10. Therefore, the recess portion 22C can also house three light emitting elements that emit red, green, and blue light, for example.

In the above embodiment, the base part 21 and the side wall part 22 of the recess portion 22C were both molded integrally with the package 20 containing the particles 20b, but this is not the only option. Of the recess portion 22C, just the side wall part 22 may be constituted with the package 20, and the base part 21 may be constituted with a different member.

In the above embodiment, the microcracks 40a were formed in the processing of lowering the temperature after film formation, but this is not the only option. For instance, the microcracks 40a can also be formed in a reflow step during secondary mounting of the light emitting device 100, or the step of curing the sealing member 50. Also, the microcracks 40a can be formed not only by a step of heating the package 20, such as a curing step or reflow step, but also by a step of cooling the package 20.

In the above embodiment, the particles 20b were dispersed evenly in the interior of the package 20 that forms the side wall part 22, but the particles 20b need only be present near the inner peripheral face 22S in the side wall part 22.

In the above embodiment, the cover film 40 covers the top face 22T of the side wall part 22 and the inner peripheral face 22S of the recess portion 22C formed entirely by the package 20, the exposed face 30S of the leads 30, and the surface of the light emitting element 10, but the cover film 40 may be applied to cover at least a part of the inner peripheral face 22S of the recess portion. Here again, protection of the package 20 and suppression of discoloration can be achieved.

Figure 7:
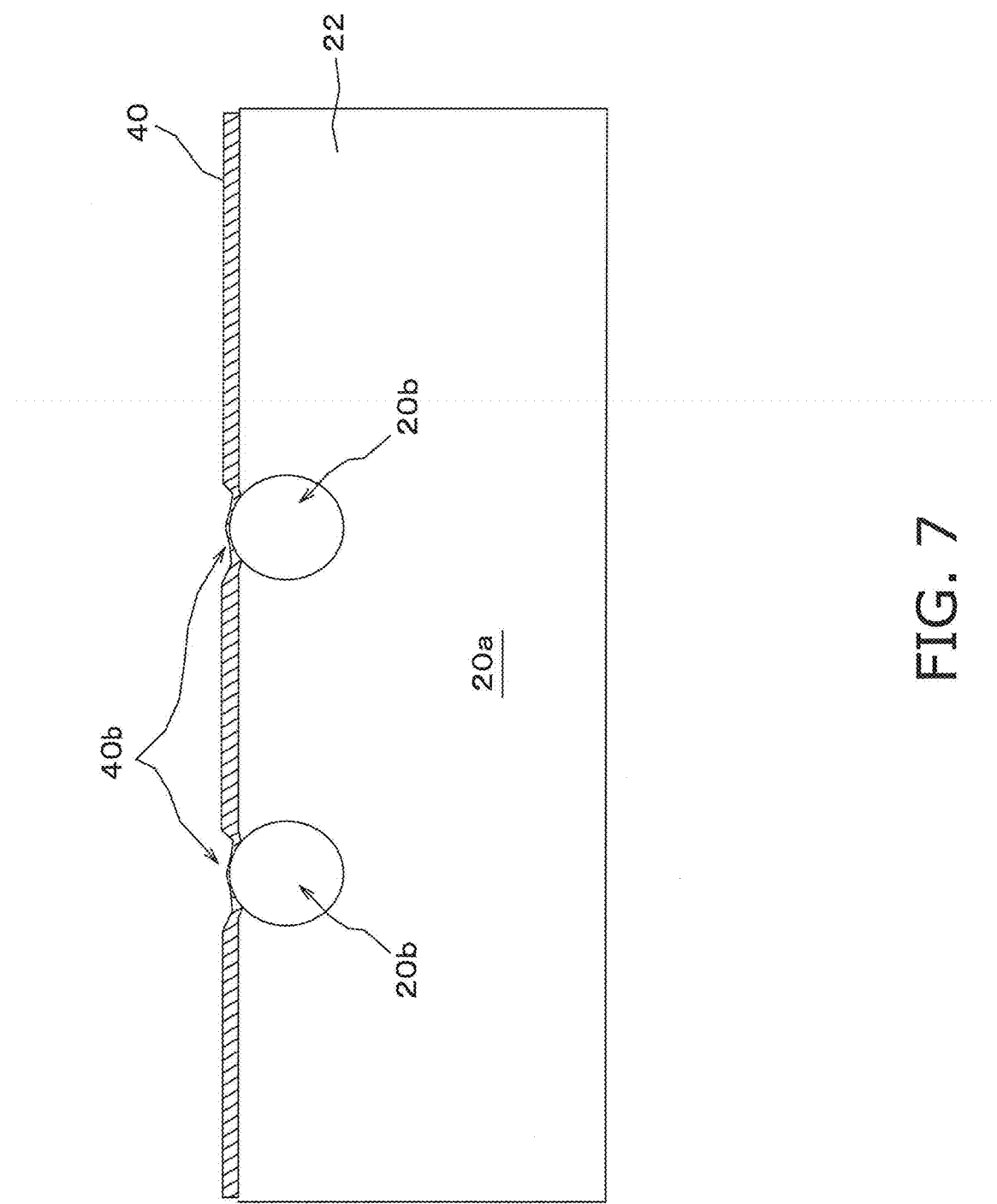
FIG. 7 is a schematic cross section of a package and a cover film.

In the above embodiment, the microcracks 40a were provided to the cover film 40 so that decomposition products and oxygen could pass through the cover film 40, but this is not the only option. As shown in FIG. 7, the cover film 40 may be made locally thinner near the particles 20b. In this case, discoloration of the package 20 can be suppressed by allowing decomposition products and oxygen to pass through thin-wall portions 40b of the cover film 40. The thin-wall portions 40b can be formed by having some of the TMA gas be absorbed by silicone particles during film formation by ALD. Accordingly, the thin-wall portions 40b can be easily formed by using silicone particles as the particles 20b.

Figure 8:
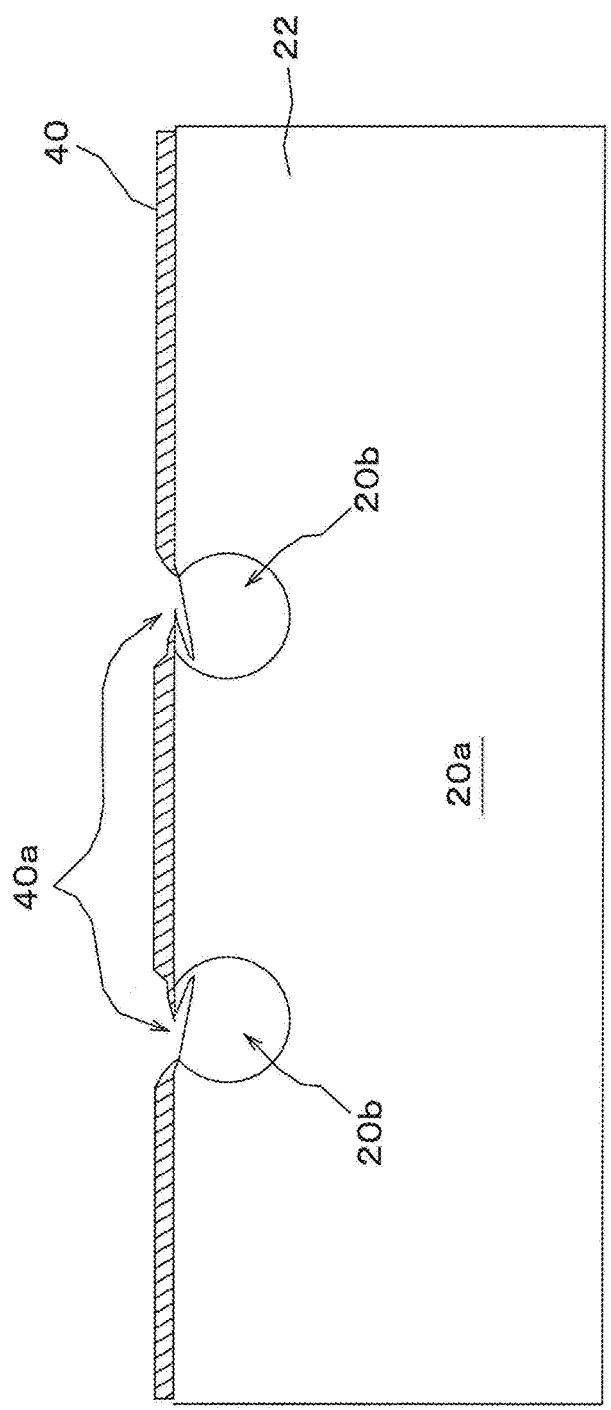
FIG. 8 is a schematic cross section of a package and a cover film.

In the above embodiment, the microcracks 40a were formed by tearing parts of the cover film 40, but this is not the only option. For example, as shown in FIG. 8, in the case where cutouts are made in the particles 20b, the microcracks 40a can be formed along these cutouts. In this case, the microcracks 40a can be easily formed without relying on a step of raising or lowering the temperature.

It should go without saying that various embodiments and so forth not discussed herein are encompassed by the present invention. Accordingly, the technical scope of the present invention is intended to be defined only by the invention according to the scope of the pertinent patent claims, from the description given above.

What is claimed is:

1. A method for manufacturing a light emitting device comprising:
    integrally molding a package and a lead, the package forming at least part of an inner peripheral face of a recess portion in which a light emitting element is housed, the package including a base material and a plurality of particles, the base material including a resin, a coefficient of thermal expansion of the particles being different from a coefficient of thermal expansion of the base material;
    covering the inner peripheral face of the recess portion with a cover film, the cover film having light transmissive and electrical insulation properties; and
    forming a plurality of microcracks in the cover film after the covering of the inner peripheral face with the cover film, the plurality of microcracks penetrating through the cover film and being generated by the particles tearing the cover film.

2. The method for manufacturing a light emitting device according to claim 1, wherein
    the covering of the inner peripheral face includes forming the cover film by atomic layer deposition.

3. The method for manufacturing a light emitting device according to claim 1, wherein
the covering of the inner peripheral face includes covering a surface of the lead with the cover film.

4. The method for manufacturing a light emitting device according to claim 1, wherein
the forming of the microcracks includes heating or cooling the package.

5. A method for manufacturing a light emitting device comprising:
integrally molding a package and a lead, the package forming at least part of an inner peripheral face of a recess portion in which a light emitting element is housed, the package including a base material and a plurality of particles, the base material including a resin, a coefficient of thermal expansion of the particles being different from a coefficient of thermal expansion of the base material;
covering the inner peripheral face of the recess portion with a cover film, the cover film having light transmissive and electrical insulation properties; and
heating or cooling the package so as to reduce a thickness of the cover film over the particles such that a distance between an upper surface of the particles and an upper surface of a portion of the cover film over the particles is smaller than a distance between an upper surface of the base material and an upper surface of other portion of the cover film.

* * * * *